(12) United States Patent
Wang

(10) Patent No.: US 9,813,025 B2
(45) Date of Patent: Nov. 7, 2017

(54) APPARATUS AND METHOD FOR POWER SUPPLY MODULATION

(71) Applicant: Nokia Technologies Oy, Espoo (FI)

(72) Inventor: Zhancang Wang, Beijing (CN)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 15/027,814

(22) PCT Filed: Oct. 8, 2013

(86) PCT No.: PCT/CN2013/084841
§ 371 (c)(1),
(2) Date: Apr. 7, 2016

(87) PCT Pub. No.: WO2015/051494
PCT Pub. Date: Apr. 16, 2015

(65) Prior Publication Data
US 2016/0254785 A1    Sep. 1, 2016

(51) Int. Cl.
*H03G 3/20* (2006.01)
*H03F 1/02* (2006.01)
(Continued)

(52) U.S. Cl.
CPC ........... *H03F 1/0222* (2013.01); *H03F 3/193* (2013.01); *H03F 3/195* (2013.01); *H03F 3/245* (2013.01);
(Continued)

(58) Field of Classification Search
CPC ....................................................... H03G 3/20
(Continued)

(56) References Cited

U.S. PATENT DOCUMENTS

| 5,420,536 A * | 5/1995 | Faulkner ............... H03C 3/406 |
| | | 330/129 |
| 7,541,867 B2 * | 6/2009 | Taylor .................. H04L 27/361 |
| | | 330/129 |

(Continued)

FOREIGN PATENT DOCUMENTS

| WO | 2012148918 | 11/2012 |
| WO | 2013055171 | 4/2013 |

OTHER PUBLICATIONS

International Search Report and Written Opinion received for corresponding Patent Cooperation Treaty Application No. PCT/CN2013/084841, dated Jul. 18, 2014, 13 pages.

*Primary Examiner* — Henry Choe
(74) *Attorney, Agent, or Firm* — Ditthavong & Steiner P.C.

(57) ABSTRACT

Embodiments of the invention provide an apparatus for amplifying a radio frequency transmission signal, comprising: an envelope signal obtaining unit (210) configured to obtain a slow envelope signal indicating a time averaging amplitude component of the radio frequency signal and a fast envelope signal indicating an instant amplitude component of the radio frequency signal; a supply voltage modulating unit (230) configured to provide an output modulated supply voltage to the power amplifying unit by modulating a direct current supply voltage based on both the slow envelope signal and the fast envelope signal; and a power amplifying unit (220) configured to amplify power of the radio frequency transmission signal according to the output modulated supply voltage.

19 Claims, 6 Drawing Sheets

(51) Int. Cl.
  *H03F 3/195* (2006.01)
  *H03F 3/24* (2006.01)
  *H03F 3/193* (2006.01)
  *H04W 52/02* (2009.01)
  *H04W 52/28* (2009.01)
  *H04W 52/52* (2009.01)

(52) U.S. Cl.
  CPC ..... *H04W 52/0212* (2013.01); *H04W 52/283* (2013.01); *H04W 52/52* (2013.01); *H03F 2200/102* (2013.01); *H03F 2200/451* (2013.01); *H03F 2200/555* (2013.01); *Y02B 60/50* (2013.01)

(58) Field of Classification Search
  USPC ........................................ 330/136, 129, 297
  See application file for complete search history.

(56) References Cited

U.S. PATENT DOCUMENTS

| | | | |
|---|---|---|---|
| 7,965,140 B2 * | 6/2011 | Takahashi | H03F 1/0211 330/10 |
| 2001/0004223 A1 * | 6/2001 | Kim | H03F 1/3252 330/149 |
| 2004/0100326 A1 | 5/2004 | Cobley | |

* cited by examiner

US 9,813,025 B2

APPARATUS AND METHOD FOR POWER SUPPLY MODULATION

RELATED APPLICATION

This application was originally filed as PCT Application No. PCT/CN2013/084841 filed Oct. 8, 2013.

TECHNICAL FIELD

Embodiments of the invention generally relate to the field of wireless communications and more specifically, to an apparatus and method for power supply modulation based on synchronous slow and fast envelope tracking (ET).

BACKGROUND

With the development of wireless communication technologies, there has been an increase in consumer use of various multimedia signals, and an interest in fourth generation (4G) or higher generation (e.g. 5G) communication systems is rapidly increasing according to the need for rapid transmission of the various multimedia signals in mobile environments.

4G or 5G communication systems provide a higher transmission rate, a wider bandwidth, and a higher Peak to Average Power Ratio (PAPR) than other communication systems, for example, 3G or 2G, such as GSM communication systems, which may result in high power dissipation when a power amplifier is supplied with a fixed supply voltage.

Efficiency of a power amplifier drops rapidly as its output power is reduced and the power amplifier operates in a more linear region. Amplitude-modulated signals with a high PAPR, such as in a 4G LTE-A system, have a probability distribution weighted when it is far away from maximum output power, resulting in inefficient operation of the power amplifier at the time-averaging power level.

SUMMARY

Various embodiments of the invention aim at addressing at least part of the above problems and disadvantages. Other features and advantages of embodiments of the invention will also be understood from the following description of specific embodiments when read in conjunction with the accompanying drawings, which illustrate, by way of example, the principles of embodiments of the invention.

Various aspects of embodiments of the invention are set forth in the appended claims and summarized in this section. It shall be noted that the protection scope of the invention is only limited by the appended claims.

In a first aspect of the invention, there is provided an apparatus for amplifying a RF transmission signal. The apparatus may comprise an envelope signal obtaining unit configured to obtain a slow envelope signal indicating a time averaging amplitude component of the radio frequency transmission signal and a fast envelope signal indicating an instant amplitude component of the radio frequency transmission signal. The apparatus may also comprise a supply voltage modulating unit configured to provide an output modulated supply voltage to the power amplifying unit by modulating a direct current supply voltage based on both the slow envelope signal and the fast envelope signal and a power amplifying unit configured to amplify power of the radio frequency transmission signal according to the output modulated supply voltage synchronously.

In a second aspect of the invention, there is provided a device for supply voltage modulating. The device may comprise a first input port for receiving a slow envelope signal indicating a time averaging amplitude component of a radio frequency transmission signal; a second input port for receiving a fast envelope signal indicating an instant amplitude component of the radio frequency transmission signal; and an output port for outputting an output modulated supply voltage. The device may also comprise a supply voltage modulating unit configured to provide the output modulated supply voltage by modulating a direct current supply voltage based on both the slow envelope signal and the fast envelope signal.

In a third aspect of the invention, there is provided a method for amplifying a radio frequency transmission signal. The method may comprise obtaining a slow envelope signal indicating a time averaging amplitude component of the radio frequency signal and a fast envelope signal indicating an instant amplitude component of the radio frequency signal. The method may also comprise providing an output modulated supply voltage by modulating a direct current supply voltage based on both the slow envelope signal and the fast envelope signal. The method may further comprise amplifying power of the radio frequency transmission signal according to the output modulated supply voltage.

In a fourth aspect of the invention, there is provided a method for supply voltage modulating. The method may comprise receiving a slow envelope signal indicating a time averaging amplitude component of a radio frequency transmission signal and a fast envelope signal indicating an instant amplitude component of the radio frequency transmission signal; and providing an output modulated supply voltage by modulating a direct current supply voltage based on both the slow envelope signal and the fast envelope signal.

BRIEF DESCRIPTION OF THE DRAWINGS

The above and other aspects, features, and benefits of various embodiments of the invention will become more fully apparent, by way of example, from the following detailed description and the accompanying drawings, in which like reference numerals refer to the same or similar elements.

DETAILED DESCRIPTION

Figure 1:
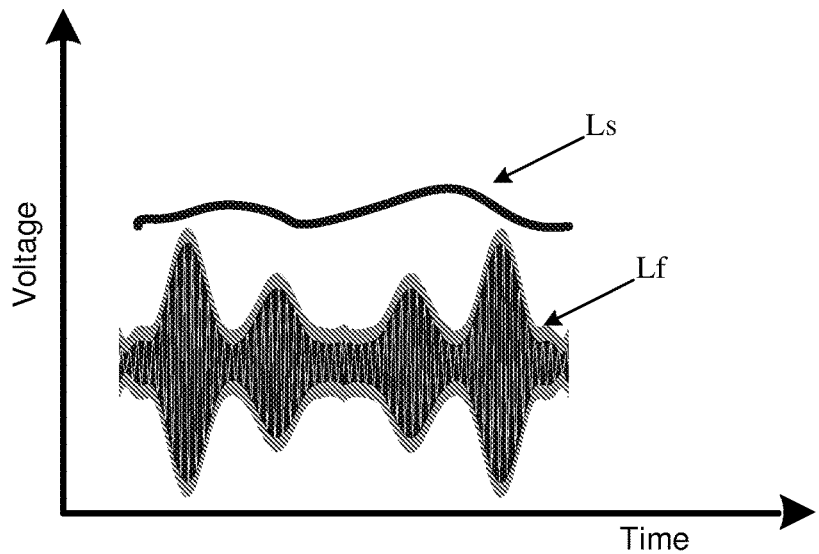
FIG. 1 illustrates a synchronous slow envelope and a fast envelope of a RF transmission signal.

In view of the problem as mentioned in the Background section, in 4G communication systems, for example, a power amplifier with a supply voltage that is modulated according to the amplitude of a radio frequency (RF) signal inputted to the amplifier is typically used, as described in a non-patent literature 1 ("Asynchronous Nonlinear Power-Tracking Supply for Power Efficient Linear RF PAs", Hsuan-I Pan et al, IEEE International Conference on Communications, Circuits, and Systems (ICCCAS), pp. 2531-2535, Guilin, China, Jun. 25-28, 2006) and a patent literature 2 (US Patent Application No. US 20130093247A1), in which the principles for supply voltage modulation are based on fast envelope tracking so as to keep supply voltage consistent with the instant amplitude of the input signal to boost efficiency of the power amplifier. However, when average input signal power is dramatically backed off and decreased according to changes of external factors, such as a smart energy saving scheme in a base station and reduction of the distance of a mobile terminal to a base station, the efficiency of a fast envelope tracking power amplifier would degrade accordingly because its dynamic range of time-averaging output power is not sufficiently wide.

The solution of non-patent literature 1 uses a fast and slow envelope with a pulse mode to boost efficiency. This solution only takes care of a high PAPR scenario, but for the case that average signal power is backed off, it cannot keep high efficiency with the amplitude of a radio frequency (RF) signal becoming much smaller while the supply voltage still keeps original two levels. The gap between the tracked supply voltage and the true RF signal's envelope will be much larger and thereby causes more power dissipation. Additionally, the fast and slow path circuits of non-patent literature 1 are digital or pulse mode (digital inverter and comparators are used) that may cause higher distortion and harmonics than analog circuits.

The solution of patent literature 2 enhances efficiency of traditional switch parts, which needs to adjust the gain of envelope tracking drain modulator (ETDM) to adapt the envelope output of ETDM 'close' enough so as to keep high efficiency. However, it is difficult to maintain high efficiency when average output power is changed due to changes of wireless traffic profile (base station application scenarios) or a distance to a base station (mobile terminal application scenarios).

In the following description, numerous specific details of embodiments of the present invention are set forth. However, it is understood that embodiments of the invention may be practiced without these specific details. In other instances, well-known circuits, structures and techniques have not been shown in detail in order not to obscure the understanding of this description. It will be appreciated, however, by those of ordinary skills in the art that the invention may be practiced without such specific details. Those of ordinary skills in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. It shall be understood that the singular forms "a", "an" and "the" include plural referents unless the context explicitly indicates otherwise.

Reference is first made to FIG. 1, in which a slow envelope and a fast envelope of a RF transmission signal is illustrated. The term "slow envelope" used herein refers to the time-averaging amplitude component of the RF transmission signal in a long term, which may be a function of some slow changing external factors, such as a distance of a mobile terminal to a base station, and traffic profile of a base station in a cell. The term "fast envelope" used herein refers to instant amplitude component of the RF transmission signal. As illustrated in FIG. 1, a solid line Ls indicates the slow envelope, and a thinner solid line Lf indicates the fast envelope.

Figure 2:
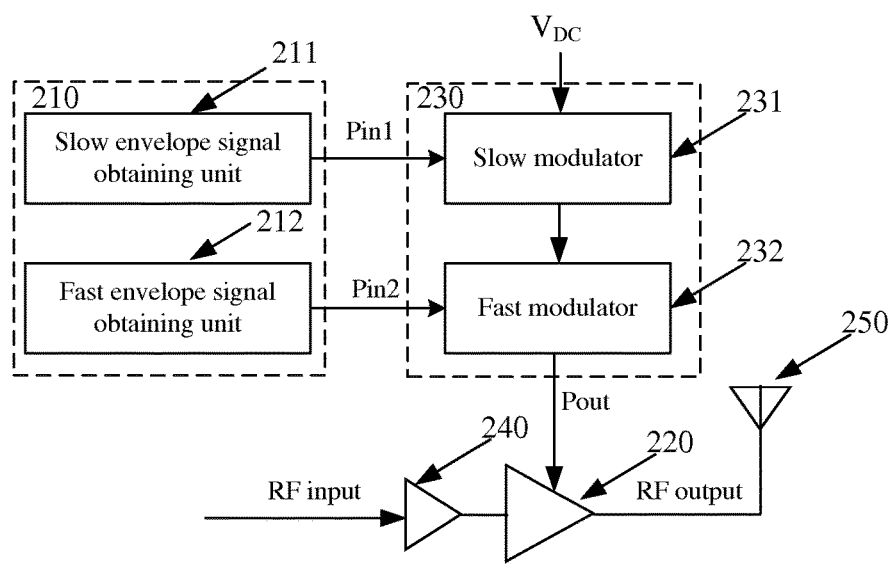
FIG. 2 illustrates architecture of an apparatus for amplifying a RF transmission signal according to an embodiment of the present invention.

FIG. 2 illustrates architecture of an apparatus for amplifying a RF transmission signal according to an embodiment of the present invention. The depicted architecture may comprise an envelope signal obtaining unit 210 for obtaining a signal representing the slow envelope of the RF transmission signal (which is referred to as a slow envelope signal hereafter) and a signal representing the fast envelope of the RF transmission signal (which is referred to as a fast envelope signal hereafter). In one embodiment, the envelope signal obtaining unit 210 may further comprise a slow envelope obtaining unit 211, which is preferably configured to obtain the slow envelope signal from a baseband transmission signal according to different application scenarios, for example, by using a digital-to-analog converter (DAC) to generate an envelope signal; and a fast envelope obtaining unit 212, which is configured to obtain the fast envelope signal from either a baseband transmission signal or a RF transmission signal, for example, by using a known envelope detector, or using a DAC to generate an envelope signal. The architecture also comprises a power amplifying unit 220 for amplifying power of the RF transmission signal; and a two-level cascade supply modulating unit 230 for providing a modulated supply voltage to the power amplifying unit 220 by modulating a direct current (DC) supply voltage $V_{DC}$. The architecture may further comprise a driver amplifier 240 for providing sufficient driving power level to the power amplifying unit 220 and an antenna unit 250 for transmitting the amplified RF transmission signal.

In one embodiment, the two-level cascade supply modulating unit 230 may further comprise a slow modulator 231 which is configured to modulate the DC supply voltage, e.g. the voltage of a battery, or 48V DC supply for a base station, based on the slow envelope signal so as to output an intermediate supply voltage that may vary according to the time-averaging amplitude component of the RF transmission signal. The output supply voltage from the slow modulator 231 will be provided to a fast modulator 232 that is configured to further modulate the intermediate supply voltage based on the fast envelope signal so as to output the modulated supply voltage that may vary according to the changes of both the slow envelope and the fast envelope.

Preferably, the two-level cascade supply modulating unit 230 may be implemented as a triple port device comprising two input ports (Pin1, Pin2) for receiving the slow envelope signal and the fast envelope signal respectively and synchronously, and an output port (Pout) for outputting the modulated supply voltage to the power amplifying unit 220.

The power amplifying unit 220 which is supplied with the modulated supply voltage can amplify power of the RF transmission signal according to changes of the slow envelope and the fast envelope synchronously. Accordingly, the gap between the amplified signal outputted from the amplifying unit 230 and its supply voltage can be reduced and the power dissipation caused therefor is also reduced.

Figure 3:
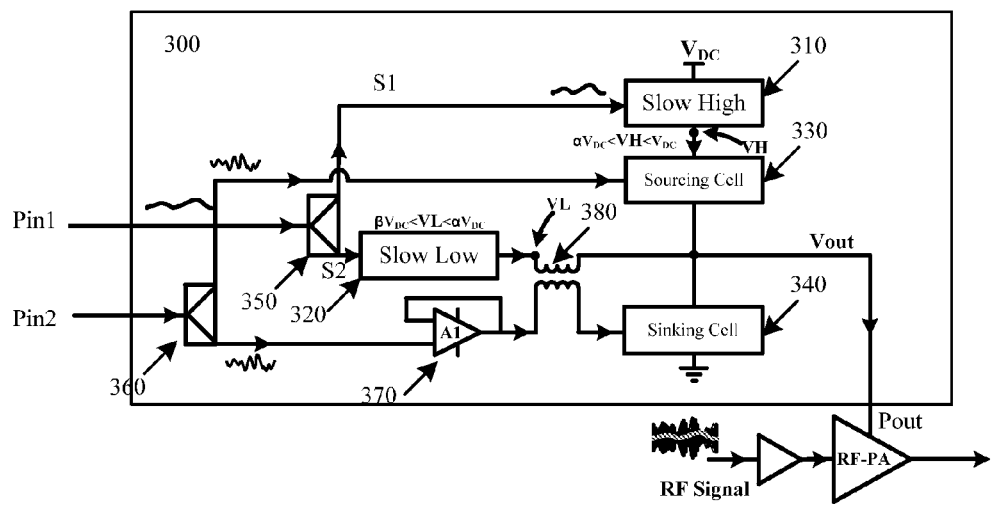
FIG. 3 illustrates a detailed block diagram of a supply modulating module applied for a power amplifier according to an embodiment of the present invention.

FIG. 3 illustrates a detailed block diagram of a supply modulating module 300 according to an embodiment of the present invention. The techniques to obtain the envelope signals are well known in the art, for example, using a known envelope detector, or using a DAC to generate the envelope signals from baseband transmission signals, and thus will not be detailed herein for a purpose of conciseness.

As illustrated in FIG. 3, the supply modulating module 300 may comprise a slow high modulating cell 310 and a slow low modulating cell 320 which constitute the slow modulator as illustrated in FIG. 2, and may further comprise a fast upper sourcing cell 330 and a fast lower sinking cell 340 which constitute the fast modulator as illustrated in FIG. 2. Both the slow high modulating cell 310 and the slow low modulating cell 320 are supplied with a DC voltage $V_{DC}$, such as a voltage of a battery Vbat, or 48V standard base station DC supply.

The supply modulating module 300 may further comprise a power splitter 350 which divides the slow envelope signal received from a first input port Pin1 into a first component signal S1 and a second component signal S2 to be inputted to the slow high modulating cell 310 and the slow low modulating cell 320 respectively. Then, the slow high modulating cell 310 can modulate the DC supply voltage $V_{DC}$, based on the first component signal and thereby output a high modulated supply voltage VH to the fast upper sourcing cell 330, wherein $\alpha \cdot V_{DC} < VH < V_{DC}$, α is a coefficient of a value within 0 to 1. Similarly, the slow low modulating cell 320 can modulate the DC supply voltage $V_{DC}$, based on the second component signal and thereby output a low modulated supply voltage VL to the fast lower sourcing cell 330 via a transformer 380, wherein $\beta \cdot V_{DC} < VL < \alpha \cdot V_{DC}$, β is a coefficient of a value within 0 to 1 and less than α. Circuits for implementing the slow high modulating cell 310 and the slow low modulating cell 320 are known in the art. For example, each of them can be implemented by a DC-DC converter by receiving the slow envelope signal as an external input trigger signal. Both VL and VH may vary according to changes of a distance to a base station or wireless traffic profile of a base station in a cell. VL interleaves with VH to supply power to the fast lower sinking cell and the fast upper sourcing cell synchronously so as to combine them together to provide a final output Vout with high efficiency.

The fast envelope signal received from a second input port Pin2 may also be divided by a power splitter 360 onto two paths leading to the fast upper sourcing cell 330 and the fast lower sinking cell 340 respectively, which are referred to as an upper path and a lower path hereafter. On the upper path, a half of the fast envelope signal may be coupled directly to the fast upper sourcing cell 330. On the lower path, preferably, a half of the fast envelope signal may be inverted with 180° out-phasing by an inverter amplifier 370 and then coupled to the fast lower sinking cell 340 via a transformer 380. Since the fast envelope signal is inverted by the inverter amplifier, there is a 180° phase difference between the fast envelope signal inputted to the fast upper sourcing cell and the inverted fast envelope signal, which enables the fast lower sinking cell 340 to absorb the current generated from the upper sourcing cell 330 that deviates from the original fast envelope signal so as to keep the output Vout with the minimum distortion. Additionally, the inverter amplifier 370 can also adjust the bias and gain to drive the fast lower sinking cell 340.

Functions of the transformer 380 lie in two aspects. In one aspect, the transformer 380 may couple the low modulated supply voltage VL outputted from the slow low modulating cell 320 to the final output Vout in proportion to the amplitude of the fast envelope signal. In the other aspect, the transformer 380 may provide a common mode feedback from the output of the fast modulator to the input of the fast lower sinking cell 340 and thus it may be possible to offer a stable and wider bandwidth by using this negative feedback scheme.

The embodiment of the present invention consists multiple dimensional supply tracking and thus it may be possible to cover both the instant high PAPR and the slow change of average power of the RF transmission signal over time in a long term, e.g. due to a distance change or traffic profile change. By this means, high efficiency of a power amplifier may be achieved not only for an instant high PAPR signal, but also for a signal with average power being backed-off. The embodiment of the present invention builds a solid relation to application scenarios, e.g. use in a mobile terminal associated with the distance change to a base station or use in a base station associated with the traffic profile change.

Figure 4:
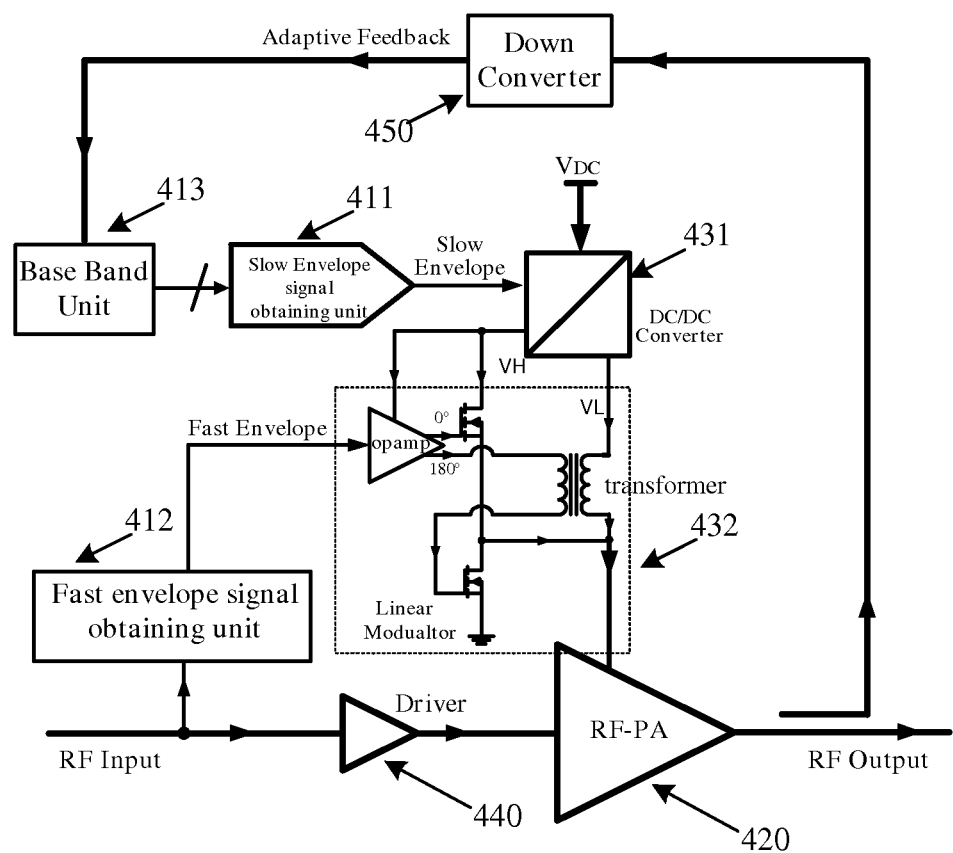
FIG. 4 illustrates a block diagram of a specific example implementation of an apparatus for amplifying a RF transmission signal according to an embodiment of the present invention.

FIG. 4 illustrates a block diagram of a specific example implementation of an apparatus for amplifying a RF transmission signal according to one embodiment of the present invention. It shall be understood that the scope of the present invention is not limited to this specific example.

As illustrated in FIG. 4, a RF transmission signal may be input to a fast envelope signal obtaining unit 412, which obtains the fast envelope signal from the RF transmission signal and provides it to a fast modulator 432 that may be a linear modulator. Similar to the fast modulator as described above with respect to FIG. 3, in the fast modulator 432, the input fast envelope signal is divided into two component signals by an operational amplifier (OPAMP) with one component signal being inverted. The OPAMP can function as the power splitter and the inverter as described above. The two component signals are in turn input to two NMOS transistors in a form of "totem pole", wherein the inverted component signal is coupled to the lower NMOS transistor via a transformer. Meanwhile, a slow envelope signal obtaining unit 411 obtains the slow envelope signal from a baseband transmission signal processed in a base band unit 413. The base band unit 413 may process the baseband transmission signal so as to, for example, reduce a crest factor, perform a digital pre-distortion correction algorithm and improve timing/offset alignment, according to an adaptive feedback signal down-converted from the RF output of a RF power amplifier 420 by a down converter 450. The slow envelope signal is then input into a DC-DC converter, which generates a VH signal and a VL signal for driving the fast modulator 432. The output supply voltage from the fast modulator 432 may be input to the RF power amplifier 420. According to the output supply voltage which varies depending on both the slow envelope signal and the fast envelope signal, the RF power amplifier 420 may amplify power of the RF input signal with reduced power dissipation.

Figure 5:
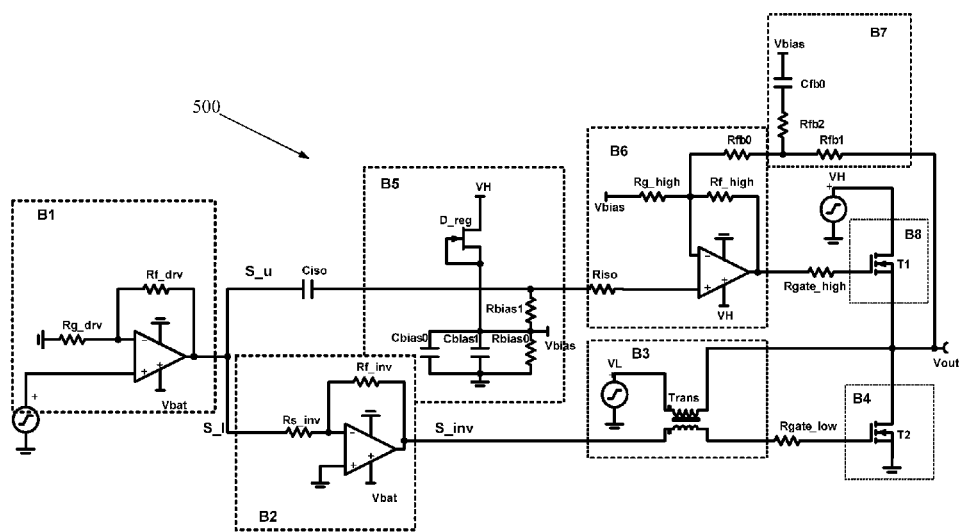
FIG. 5 illustrates a detailed schematic circuit of an example for a supply modulating module according to an embodiment of the present invention.

FIG. 5 illustrates a detailed schematic circuit of an example for a supply modulating module 500 according to an embodiment of the present invention. It shall be understood that the scope of the present invention is not limited to this specific example.

In this example circuit, the slow high modulator and the slow low modulator are respectively simplified as symbols VH and VL, which may be implemented by known devices in the art, such as a DC-DC converter by receiving the slow envelope signal as an external input trigger signal, e.g. the DC-DC converter 431 as illustrated in FIG. 4.

In the following, descriptions will be made in a signal flow direction, i.e., from the left to the right.

The illustrated supply modulating module 400 may comprise a pre-driver amplifier B1 which can amplify the fast envelope signal so as to provide sufficient rail to rail supply voltage to the power amplifier. For example, the pre-driver amplifier B1 can be implemented by an in-phase OPAMP with a gain adjustment by the ratio of a feedback resistor Rf_drv and a biasing resistor Rg_drv as the following:

$$LinearGain = 1 + \frac{Rf\_drv}{Rg\_drv}.$$

The amplified signal from the pre-driver amplifier B1 can then be divided into an upper component signal S_u and a lower component signal S_l to be transmitted along the upper path and the lower path as described above. On the lower path, the lower component signal S_l can be firstly inverted by an inverter amplifier B2, which inverts the phase of S_l to introduce a 180° inversion. Meanwhile, the inverter amplifier B2 may also adjust its gain and bias level to fit for the lower sinking cell to absorb the deviating current. For example, the inverter amplifier B2 may be implemented by an inverted-phase OPAMP with a gain adjustment by the ratio of a feedback resistor Rf_inv and a biasing resistor Rs_inv as the following:

$$LinearGain = -\frac{Rf\_inv}{Rs\_inv}.$$

The inverted signal S_inv may then be coupled to the fast lower sinking cell B4 via a transformer B3. The fast lower sinking cell B4 is implemented as an N-channel Metal-Oxide-Semiconductor (NMOS) power transistor in this embodiment. The lower sinking transistor may sink the redundant current generated from supply modulation and amplification process of a fast upper sourcing cell B8 that is an upper sourcing transistor in this embodiment to keep the output voltage Vout and current with the minimum distortion. Additionally, the lower sinking power transistor may be combined with the upper sourcing transistor to form a "totem pole" linear amplifier, which has superior bandwidth performance than a traditional "push pull" amplifier using complementary NMOS and PMOS transistors due to a lower value of total input capacitance. In this architecture, when the upper sourcing cell is operating and amplifying the signal above the average value $\alpha \cdot V_{DC}$, the lower sinking cell is shut down at that time; and when the lower sinking cell is operating and sinking the redundant current from the output Vout to keep the minimum distortion of the output Vout, the upper sourcing cell is shut down at that time.

The transformer B3 plays a role as common mode negative feedback from the output Vout to the input of the fast lower sinking cell B4, by which at least three advantages, such as distortion suppression, bandwidth broadening, and superior stability may be offered. Also the transformer B3 may couple the low modulated supply voltage VL into the output Vout.

On the upper path, the supply modulating module may further comprise a bias voltage generator B5 which provides a constant bias voltage Vbias to the following circuits, such as a driver amplifier B6 and a global feedback circuit B7 (which will be described later) on the upper path. The upper component signal S_u may be coupled via a capacitor Ciso to the bias voltage generator B5, which may be implemented by a current regulation diode (D_reg) or other biasing networks or circuits, e.g. a Junction Field-effect Transistor (JFET).

The driver amplifier B6 is supplied with the high modulated supply voltage VH and is biased with the bias voltage Vbias generated by the bias voltage generator B5 to provide a sufficient driving current level to the fast upper sourcing cell B8, which may be implemented as an NMOS transistor. It also works as a summing node to receive the output of the global feedback circuit B7. The driver amplifier B6 may be implemented with an in-phase OPAMP with a gain adjustment by the ratio of a feedback resistor Rf_high and a bias resistor Rg_high, wherein, the bias resistor Rg_high is not connected to ground but to the voltage Vbias voltage. The linear gain of this driver amplifier B6 is:

$$LinearGain = 1 + \frac{Rf\_high}{Rg\_high}.$$

The fast upper sourcing cell B8 that is a sourcing transistor in this embodiment sources the VH supply to provide most of the supply power to the output Vout. It is an NMOS transistor and combined with the lower sinking transistor B4 to form the "totem pole" architecture.

The global feedback circuit B7 is consisted of resistors Rfb2, Rfb1 and a capacitor to form a filter for filtering out the output noise and interference, and also form a feedback to the driver amplifier B6 so as to provide several advantages, such as a global stability, wide bandwidth, distortion suppression, interference immunity. The global feedback circuit B7 is coupled to the bias voltage Vbias instead of ground as a reference, by which it keeps the average voltage $\alpha \cdot V_{DC}$ of the output Vout constant to Vbias so as to avoid deviating the output average voltage from desired values. The RC network may be built in a higher order than shown in FIG. 4 so as to provide better noise suppression performance.

Figure 6:
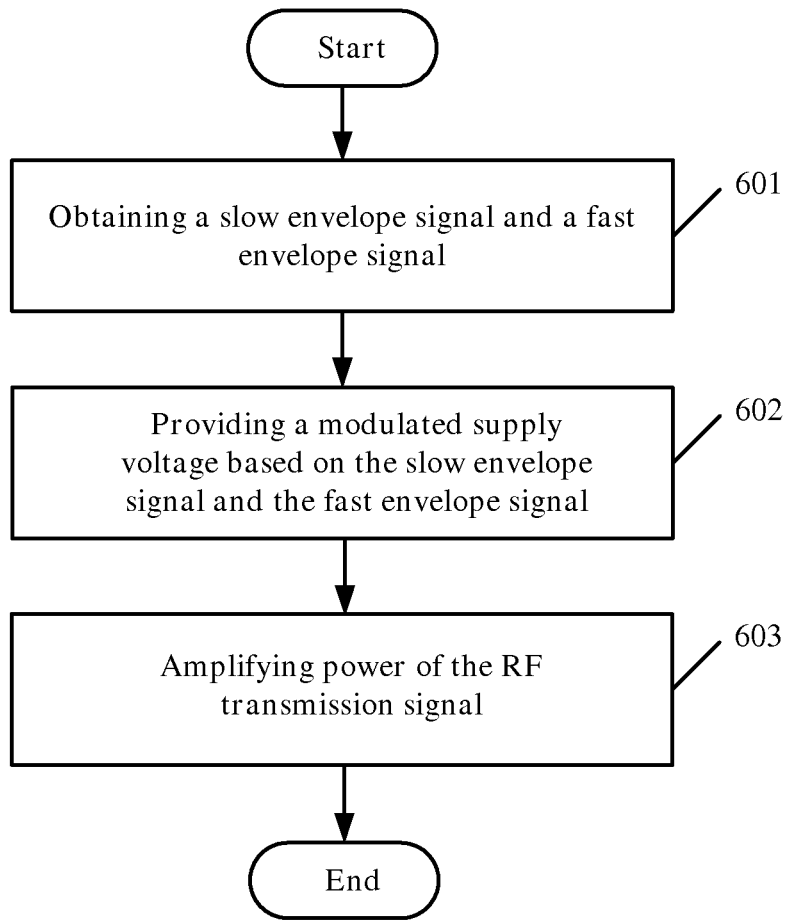
FIG. 6 illustrates a method for amplifying a RF transmission signal according to an embodiment of the present invention.

FIG. 6 illustrates a method 600 for amplifying a RF transmission signal according to an embodiment of the present invention. As illustrated in FIG. 6, in block 601, a signal indicating the time-averaging amplitude component of a RF transmission signal, i.e. the slow envelope signal as described above, and a signal indicating an instant amplitude component, i.e. the fast envelope signal as described above are obtained. Then in block 602, an output modulated supply voltage may be provided by modulating a DC supply voltage based on both the slow envelope signal and the fast envelope signal, and then in block 603, power of the RF transmission signal may be amplified according to the modulated supply voltage.

In one embodiment, the function in block 603 may be realized through providing a first intermediate supply voltage by modulating a direct current supply voltage based on the slow envelope signal and further providing the modulated supply voltage by modulating the first intermediate supply voltage based on the fast envelope signal.

In another embodiment, said providing the first intermediate supply voltage may further comprise: dividing the slow envelope signal into a first component signal and a second component signal; then providing a high modulated supply voltage by modulating the DC supply voltage based on the first component signal and providing a low modulated supply voltage lower than the high modulated supply voltage by modulating the DC supply voltage based on the second component signal. Meanwhile, said providing the output modulated supply voltage from the first intermediate supply voltage may further comprise dividing the fast envelope signal into an upper (or third) component signal and a lower (or fourth) component signal; then providing a second intermediate supply voltage by modulating the high modulated supply voltage based on the upper component signal; and coupling the low modulated supply voltage to the second intermediate supply voltage in proportion to the lower component signal; absorbing redundant current from the second intermediate supply voltage that deviates from the fast envelop signal and then outputting the second intermediate supply voltage as the output modulated supply voltage to the power amplifier.

Figure 7:
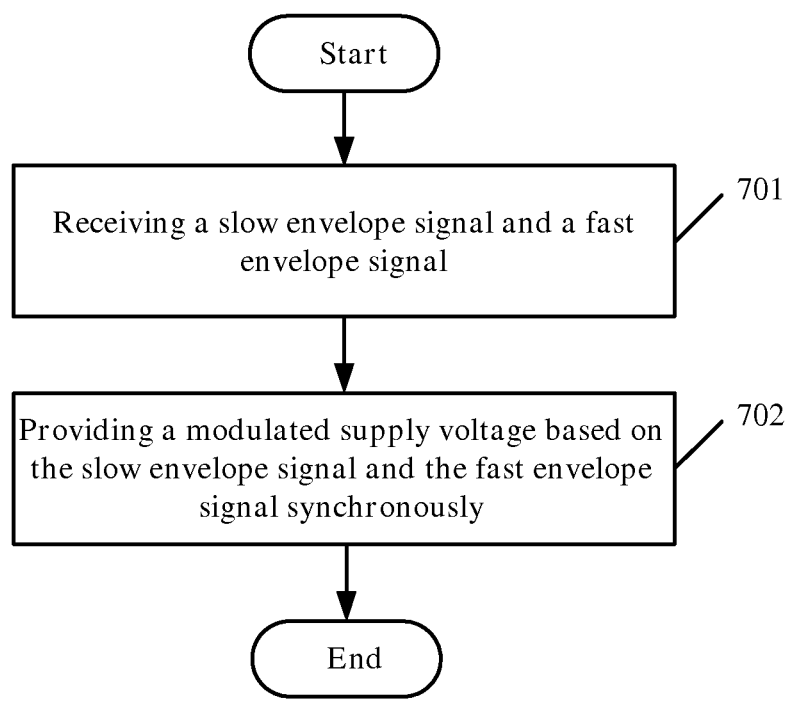
FIG. 7 illustrates a method for modulating supply voltage according to an embodiment of the present invention.

FIG. 7 illustrates a method 700 for modulating a supply voltage according to an embodiment of the present invention. In block 701 of FIG. 7, a signal indicating the time-averaging amplitude component of a RF transmission signal, i.e. the slow envelope signal as described above, and a signal indicating an instant amplitude component of the RF transmission signal, i.e. the fast envelope signal as described above are received. Then in block 702, based on both the slow envelope signal and the fast envelope signal, a modulated supply voltage can be provided by modulating a DC supply voltage.

Various embodiments described in this specification may be implemented to comprise multiple dimensional supply modulating that covers both the case of an instant high PAPR and the case that a long term time-averaging power level changes due to a distance change or a traffic profile change. By this means, high efficiency of a power amplifier may be achieved not only for an instant high PAPR signal, but also for a signal with average power being backed-off, thereby reducing power dissipation of the power amplifier.

While this specification contains many specific implementation details, these should not be construed as limitations on the scope of any implementation or of what may be claimed, but rather as descriptions of features that may be specific to particular embodiments of particular implementations. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

It should also be noted that the above described embodiments are given for describing rather than limiting the invention, and it is to be understood that modifications and variations may be resorted to without departing from the spirit and scope of the invention as those skilled in the art readily understand. Such modifications and variations are considered to be within the scope of the invention and the appended claims. The protection scope of the invention is defined by the accompanying claims. In addition, any of the reference numerals in the claims should not be interpreted as a limitation to the claims. Use of the verb "comprise" and its conjugations does not exclude the presence of elements or steps other than those stated in a claim. The indefinite article "a" or "an" preceding an element or step does not exclude the presence of a plurality of such elements or steps.

What is claimed is:

1. An apparatus for amplifying a radio frequency transmission signal, the apparatus comprising:
    an envelope signal obtaining unit configured to obtain a slow envelope signal indicating a time averaging amplitude component of the radio frequency transmission signal and a fast envelope signal indicating an instant amplitude component of the radio frequency transmission signal;
    a supply voltage modulating unit configured to provide an output modulated supply voltage to the power amplifying unit by modulating a direct current supply voltage based on both the synchronous slow envelope signal and the fast envelope signal,
        wherein the supply voltage modulating unit further comprises a slow modulator and a fast modulator synchronously,
        wherein the slow modulator is supplied with the direct current supply voltage and configured to provide a first intermediate supply voltage to the fast modulator by modulating the direct current supply voltage synchronously based on the slow envelope signal; and
    a power amplifying unit configured to amplify power of the radio frequency transmission signal according to the output modulated supply voltage.

2. The apparatus of claim 1, wherein the envelope signal obtaining unit is further configured to obtain the slow envelope signal from a baseband transmission signal and to obtain the fast envelope signal from either the baseband transmission signal or the radio frequency transmission signal.

3. The apparatus of claim 1, wherein the slow modulator comprises:
    a first power splitter for dividing the slow envelope signal into a first component signal and a second component signal, and
    a first modulating portion for providing a high modulated supply voltage by modulating the direct current supply voltage based on the first component signal,
        wherein the fast modulator is configured to provide the output modulated supply voltage to the power amplifying unit by modulating the first intermediate supply voltage based on the fast envelope signal.

4. The apparatus of claim 3, wherein the slow modulator further comprises:
    a second modulating portion for providing a low modulated supply voltage lower than the high modulated supply voltage by modulating the direct current supply voltage based on the second component signal; and
    wherein the fast modulator comprises:
    a second power splitter for dividing the fast envelope signal into a third component signal and a fourth component signal;
    a third modulating portion for providing a second intermediate supply voltage by modulating the high modulated supply voltage based on the third component signal;
    a transformer for coupling the low modulated supply voltage to the second intermediate supply voltage in proportion to the fourth component signal and for feeding the output modulated supply voltage back to an input of a fourth modulating portion; and the fourth modulating portion for absorbing redundant current from the output of the third modulating portion that deviates from the fast envelope signal.

5. The apparatus of claim 4, wherein
the fast modulator further comprises an inverter amplifier coupled between the envelope signal obtaining unit and the transformer for inverting the fourth component signal.

6. The apparatus of claim 1, wherein
the apparatus is a mobile terminal; and
the slow envelope signal varies according to the change of a distance of the mobile terminal to a base station.

7. The apparatus of claim 1, wherein
the apparatus is a base station; and
the fast envelope signal varies according to the change of traffic profile of the base station in a cell.

8. A device for supply voltage modulating, the device comprising:
a first input port for receiving a slow envelope signal indicating a time averaging amplitude component of a radio frequency transmission signal;
a second input port for receiving a fast envelope signal indicating an instant amplitude component of the radio frequency transmission signal;
an output port for outputting an output modulated supply voltage; and
a supply voltage modulating unit configured to provide the output modulated supply voltage by modulating a direct current supply voltage synchronously based on both the slow envelope signal and the fast envelope signal,
wherein the supply voltage modulating unit further comprises a slow modulator and a fast modulator synchronously,
wherein the slow modulator is supplied with the direct current supply voltage and configured to provide a first intermediate supply voltage to the fast modulator by modulating the direct current supply voltage synchronously based on the slow envelope signal.

9. The device of claim 8,
wherein the slow modulator comprises:
a first power splitter for dividing the slow envelope signal into a first component signal and a second component signal, and
a first modulating portion for providing a high modulated supply voltage by modulating the direct current supply voltage based on the first component signal,
wherein the fast modulator is configured to provide the output modulated supply voltage by modulating the first intermediate supply voltage based on the fast envelope signal.

10. The device of claim 9, wherein the slow modulator further comprises:
a second modulating portion for providing a low modulated supply voltage lower than the high modulated supply voltage by modulating the direct current supply voltage based on the second component signal; and
wherein the fast modulator comprises:
a second power splitter for dividing the fast envelope signal into a third component signal and a fourth component signal;
a third modulating portion for providing a second intermediate supply voltage by modulating the high modulated supply voltage based on the third component signal;
a transformer for coupling the low modulated supply voltage to the second intermediate supply voltage in proportion to the fourth component signal and for feeding the output modulated supply voltage back to an input of a fourth modulating portion; and
the fourth modulating portion for absorbing redundant current from the output of the third modulating portion that deviates from the fast envelope signal.

11. The device of claim 10, wherein
the fast modulator further comprises an inverter amplifier coupled between the envelope signal obtaining unit and the transformer for inverting the fourth component signal.

12. The device of claim 8, wherein
the device is used for a mobile terminal; and
the slow envelope signal varies according to the change of a distance of the mobile terminal to a base station.

13. The device of claim 8, wherein
the device is used for a base station; and
the fast envelope signal varies according to the change of traffic profile of the base station in a cell.

14. A method for supply voltage modulating, comprising:
receiving a slow envelope signal indicating a time averaging amplitude component of the radio frequency signal and a fast envelope signal indicating an instant amplitude component of the radio frequency signal; and
providing a first intermediate supply voltage by modulating the direct current supply voltage based on the slow envelope signal;
providing an output modulated supply voltage by modulating a direct current supply voltage based on both the slow envelope signal and the fast envelope signal and by modulating the first intermediate supply voltage based on the fast envelope signal synchronously.

15. The method of claim 14, said providing the output modulated supply voltage further comprises:
said providing the first intermediate supply voltage comprises:
dividing the slow envelope signal into a first component signal and a second component signal;
providing a high modulated supply voltage by modulating the direct current supply voltage based on the first component signal.

16. The method of claim 15, wherein said providing the first intermediate supply voltage further comprises:
providing a low modulated supply voltage lower than the high modulated supply voltage by modulating the direct current supply voltage based on the second component signal; and
said providing the output modulated supply voltage from the first intermediate supply voltage further comprises:
dividing the fast envelope signal into a third component signal and a fourth component signal;
providing a second intermediate supply voltage by modulating the high modulated supply voltage based on the third component signal;
coupling the low modulated supply voltage to the second intermediate supply voltage in proportion to the fourth component signal and feeding the output modulated supply voltage back; and absorbing redundant current that deviates from the fast envelope signal.

17. The method of claim 16, wherein said providing the output modulated supply voltage from the first intermediate supply voltage further comprises
inverting the fourth component signal and coupling the inverted fourth component signal into the transformer.

18. The method of claim 14, wherein the method is performed in a mobile terminal; and the slow envelope signal varies according to the change of a distance of the mobile terminal to a base station.

19. The method of claim 14, wherein the method is performed in a base station; and the slow envelope signal varies according to the change of traffic profile of the base station in a cell.

* * * * *